United States Patent
Choi et al.

(10) Patent No.: US 11,430,638 B2
(45) Date of Patent: Aug. 30, 2022

(54) PLASMA GENERATING APPARATUS AND GAS TREATING APPARATUS

(71) Applicant: Edwards Korea Ltd., Chungcheong-nam-do (KR)

(72) Inventors: Yun Soo Choi, Chungcheong-nam-do (KR); Chan Kyoo Ko, Chungcheong-nam-do (KR); Simone Magni, Chungcheong-nam-do (KR)

(73) Assignee: Edwards Limited, Burgess Hill (GB)

( * ) Notice: Subject to any disclaimer, the term of this patent is extended or adjusted under 35 U.S.C. 154(b) by 214 days.

(21) Appl. No.: 16/479,890

(22) PCT Filed: Dec. 28, 2017

(86) PCT No.: PCT/KR2017/015691
§ 371 (c)(1),
(2) Date: Jul. 22, 2019

(87) PCT Pub. No.: WO2018/135771
PCT Pub. Date: Jul. 26, 2018

(65) Prior Publication Data
US 2021/0327687 A1  Oct. 21, 2021

(30) Foreign Application Priority Data
Jan. 23, 2017  (KR) .................. 10-2017-0010393

(51) Int. Cl.
*H01J 37/32* (2006.01)
(52) U.S. Cl.
CPC .... *H01J 37/32669* (2013.01); *H01J 37/3244* (2013.01); *H01J 37/32055* (2013.01); *H01J 2237/002* (2013.01)
(58) Field of Classification Search
None
See application file for complete search history.

(56) References Cited

U.S. PATENT DOCUMENTS 3,663,792 A * 5/1972 Fey .................. H05H 1/50
219/121.36
4,144,444 A * 3/1979 Dementiev .......... H05B 7/185
219/121.36
(Continued)

FOREIGN PATENT DOCUMENTS

CN   101224406 A    7/2008
CN   101282782 A    10/2008
(Continued)

OTHER PUBLICATIONS

Extended Search Report from counterpart European Application No. 17892891.7, dated Nov. 16, 2020, 8 pp.
(Continued)

*Primary Examiner* — Srinivas Sathiraju
(74) *Attorney, Agent, or Firm* — Shumaker & Sieffert, P.A.

(57) ABSTRACT

A plasma generating apparatus may include a cathode assembly including a cathode, an anode assembly including an anode having therein a plasma generation space, and one or more magnetic force generators configured to generate a magnetic force. The anode assembly has one end portion in which a gas supply path is provided and the other end portion having an opening, the gas supply path configured to supply a plasma generating gas to the plasma generation space. The gas supply path is configured to generate a vortex of the plasma generating gas in the plasma generation space and said one or more magnetic force generators are arranged such that the magnetic force is generated in a direction opposite to a rotational direction of the vortex of the plasma generating gas.

18 Claims, 10 Drawing Sheets

(56) References Cited

U.S. PATENT DOCUMENTS

| | | | |
|---|---|---|---|
| 4,174,256 A | 11/1979 | Kistemaker | |
| 4,455,470 A | 6/1984 | Klein et al. | |
| 4,661,682 A * | 4/1987 | Gruner | H05H 1/42 219/121.52 |
| 4,847,466 A | 7/1989 | Pasquini et al. | |
| 4,882,465 A * | 11/1989 | Smith | B64G 1/406 219/121.36 |
| 4,896,017 A * | 1/1990 | Koppel | H05H 1/34 219/121.48 |
| 4,970,364 A * | 11/1990 | Muller | H05H 1/42 219/121.48 |
| 5,041,713 A * | 8/1991 | Weidman | H05H 1/42 219/121.48 |
| 5,090,340 A * | 2/1992 | Burgess | F23G 5/085 219/121.48 |
| 5,281,790 A * | 1/1994 | Nguyen Handfield | H05H 1/48 219/121.48 |
| 5,296,672 A * | 3/1994 | Ramakrishnan | H05H 1/50 219/121.48 |
| 6,045,618 A * | 4/2000 | Raoux | B01D 45/06 55/284 |
| 6,187,072 B1 * | 2/2001 | Cheung | C23C 16/4405 118/715 |
| 6,193,802 B1 * | 2/2001 | Pang | H01J 37/32844 118/723 R |
| 7,589,473 B2 * | 9/2009 | Suslov | H05H 1/42 315/111.21 |
| 7,928,338 B2 * | 4/2011 | Suslov | C23C 4/134 219/121.48 |
| 8,109,928 B2 * | 2/2012 | Suslov | H05H 1/34 606/45 |
| 8,536,481 B2 * | 9/2013 | Kong | H05H 7/00 219/121.52 |
| 8,802,567 B2 * | 8/2014 | Okumura | H01L 21/02667 257/428 |
| 9,150,949 B2 * | 10/2015 | Belashchenko | H05H 1/42 |
| 9,376,740 B2 * | 6/2016 | Belashchenko | H05H 1/42 |
| 9,420,680 B2 * | 8/2016 | Kusano | H05H 1/48 |
| 9,511,240 B2 * | 12/2016 | Dobrynin | A61N 1/44 |
| 9,653,265 B2 * | 5/2017 | Vandermeulen | H01J 37/08 |
| 9,926,624 B2 * | 3/2018 | Yamada | H01J 37/3211 |
| 9,997,322 B2 * | 6/2018 | Kong | H01J 1/02 |
| 2005/0227020 A1 * | 10/2005 | Sharafutdinov | C23C 16/545 427/595 |
| 2009/0113912 A1 * | 5/2009 | Kishimoto | F25B 9/002 62/259.1 |
| 2009/0188898 A1 | 7/2009 | Kong et al. | |
| 2010/0078309 A1 * | 4/2010 | Ueda | H01J 37/3405 204/298.18 |
| 2010/0252411 A1 * | 10/2010 | Awaji | H05H 1/50 204/155 |
| 2010/0276283 A1 * | 11/2010 | Muenz | H01J 37/3438 204/298.14 |
| 2011/0162523 A1 | 7/2011 | Fabbri et al. | |
| 2011/0174031 A1 * | 7/2011 | Bargiacchi | C05F 11/00 71/23 |
| 2011/0180403 A1 * | 7/2011 | Shiina | H01J 37/32669 204/298.41 |
| 2012/0097870 A1 * | 4/2012 | Leray | H01J 37/321 156/345.1 |
| 2012/0277515 A1 | 11/2012 | Lemont et al. | |
| 2013/0161298 A1 | 6/2013 | Fan et al. | |
| 2013/0236652 A1 * | 9/2013 | Belashchenko | H05H 1/42 427/446 |
| 2014/0094040 A1 * | 4/2014 | Okumura | H05H 1/28 438/798 |
| 2014/0183033 A1 * | 7/2014 | Spitzl | B01J 19/126 204/157.43 |
| 2014/0184073 A1 * | 7/2014 | Crowley | H01J 37/3444 315/111.41 |
| 2015/0021473 A1 * | 1/2015 | Vandermeulen | H01P 3/12 250/288 |
| 2016/0024635 A1 * | 1/2016 | Belashchenko | C23C 4/134 219/121.48 |
| 2016/0024849 A1 * | 1/2016 | Kocis | E21B 7/15 175/16 |
| 2016/0086774 A1 | 3/2016 | Okumura et al. | |
| 2016/0120014 A1 * | 4/2016 | Laurisch | H05H 7/001 219/121.48 |
| 2017/0086284 A1 * | 3/2017 | Carabin | H05H 1/34 |
| 2018/0228014 A1 * | 8/2018 | Magni | G05B 19/041 |
| 2018/0243687 A1 * | 8/2018 | Magni | B01D 53/323 |
| 2020/0109473 A1 * | 4/2020 | Guo | H01J 37/3277 |

FOREIGN PATENT DOCUMENTS

| | | |
|---|---|---|
| CN | 101394704 A | 3/2009 |
| CN | 102137705 A | 7/2011 |
| CN | 102387653 A | 3/2012 |
| CN | 203582762 U | 5/2014 |
| CN | 106508113 B | 7/2014 |
| CN | 204362408 U | 5/2015 |
| CN | 104707987 A | 6/2015 |
| CN | 105448636 A | 3/2016 |
| DE | 2512719 A1 | 10/1976 |
| EP | 0072408 A2 | 2/1983 |
| GB | 2484209 A | 4/2012 |
| JP | 51117977 A | 10/1976 |
| JP | S5836671 A | 3/1983 |
| JP | 6340299 A | 2/1988 |
| JP | S63250097 A | 10/1988 |
| JP | S63252398 A | 10/1988 |
| JP | 389920 A | 4/1991 |
| JP | H05144593 A | 6/1993 |
| JP | H08199372 A | 8/1996 |
| JP | H08318129 A | 12/1996 |
| JP | 2000096247 A | 4/2000 |
| JP | 2000288510 A | 10/2000 |
| JP | 2003251146 A | 9/2003 |
| JP | 2004307990 A | 11/2004 |
| JP | 20080067268 A | 7/2008 |
| JP | 2008194637 A | 8/2008 |
| JP | 2008194674 A | 8/2008 |
| JP | 2009240983 A | 10/2009 |
| JP | 2013512406 A | 4/2013 |
| JP | 2016530098 A | 9/2016 |
| KR | 20030067241 A | 8/2003 |
| KR | 20080067268 A | 7/2008 |
| KR | 20090030588 A | 3/2009 |
| KR | 20090076084 A | 7/2009 |
| KR | 20090123479 A | 12/2009 |
| KR | 20100124967 A | 11/2010 |
| KR | 20110105674 A | 9/2011 |
| KR | 1020120131959 | 12/2012 |
| WO | 2006031075 A1 | 3/2006 |
| WO | 2007043783 A1 | 4/2007 |
| WO | 2010110694 A1 | 9/2010 |
| WO | 2015172237 A1 | 11/2015 |
| WO | 2018135772 A1 | 7/2018 |

OTHER PUBLICATIONS

Office Action dated Jun. 7, 2021 for CN Application No. 201780088862.6, 17 pgs.
Search Report dated May 31, 2021 for CN Application No. 201780088862.6, 3 pgs.
Office Action dated Jul. 19, 2021 for JP Application No. 2019-560612, 14 pgs.
International Search Report dated Mar. 30, 2018 received in counterpart International Application No. PCT/KR2017/015691, 3 pp.
Written Opinion of the International Searching Authority dated Mar. 30, 2018 received in counterpart International Application No. PCT/KR2017/015691, 4 pp.
First Office Action and Search Report, and translation thereof, from counterpart Chinese Application No. 201780088854.1, dated Dec. 18, 2020, 27 pp.

(56) References Cited

OTHER PUBLICATIONS

The Notification of Rejection, and translation thereof, from counterpart Japanese Application No. 2019-560611, dated Aug. 30, 2021, 9 pp.
Office Action from U.S. Appl. No. 16/479,884, dated May 26, 2022, 16 pp.

* cited by examiner

[Fig. 1]
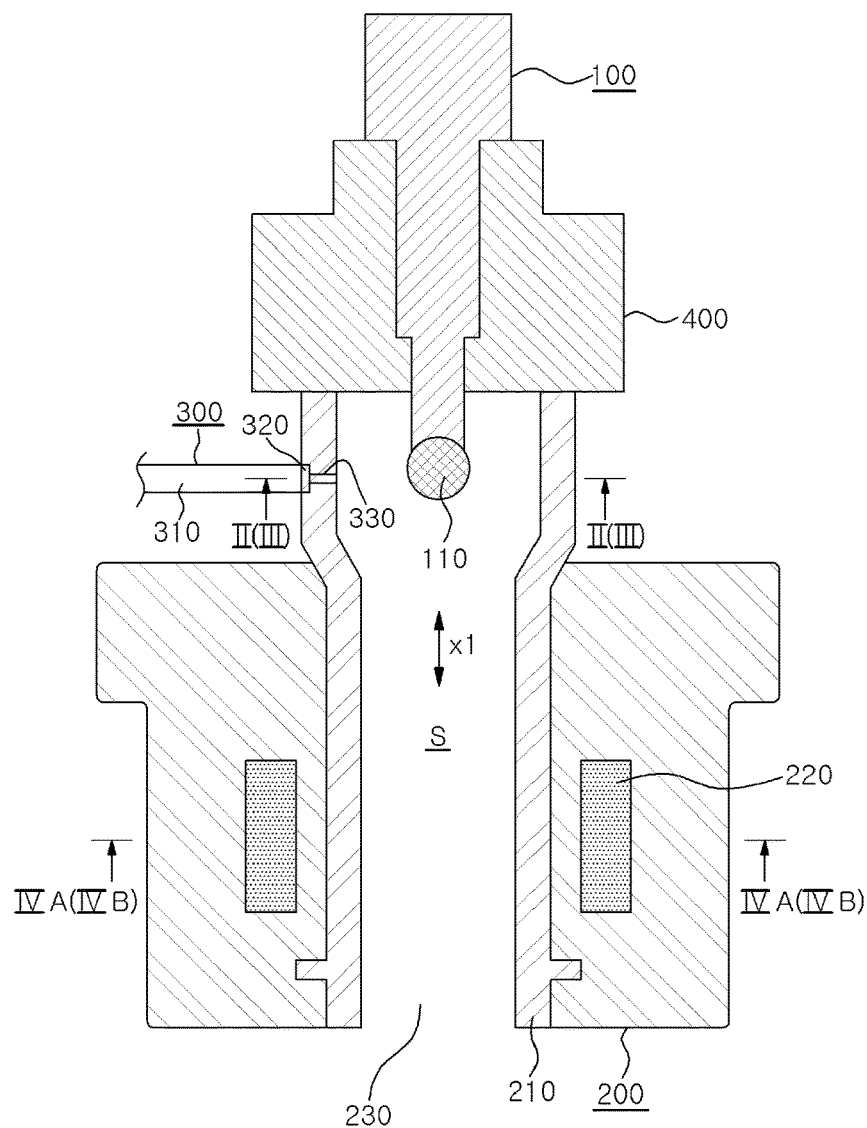
[Fig. 2]
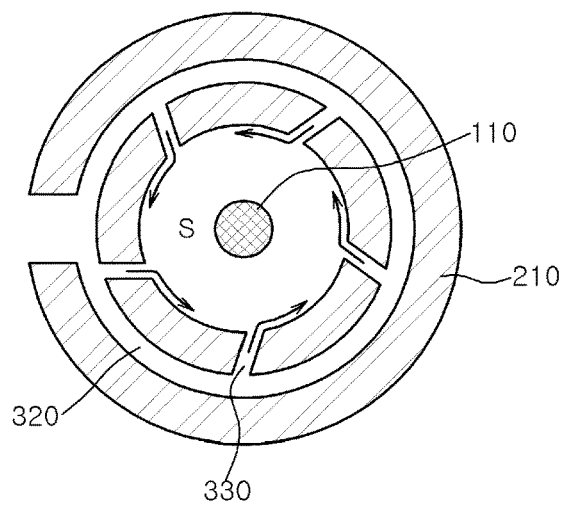

[Fig. 3]
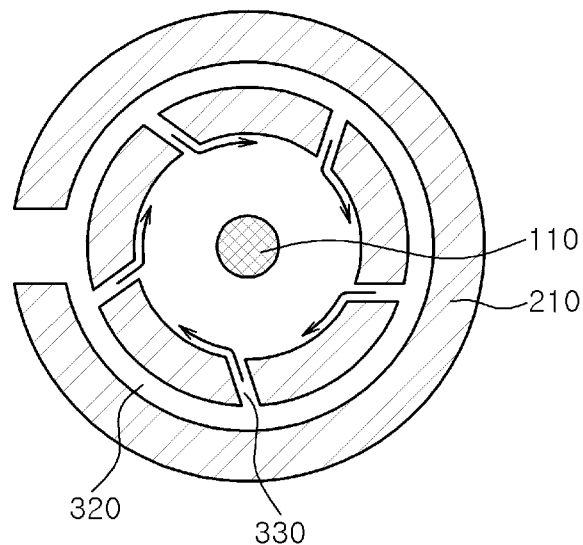
[Fig. 4a]
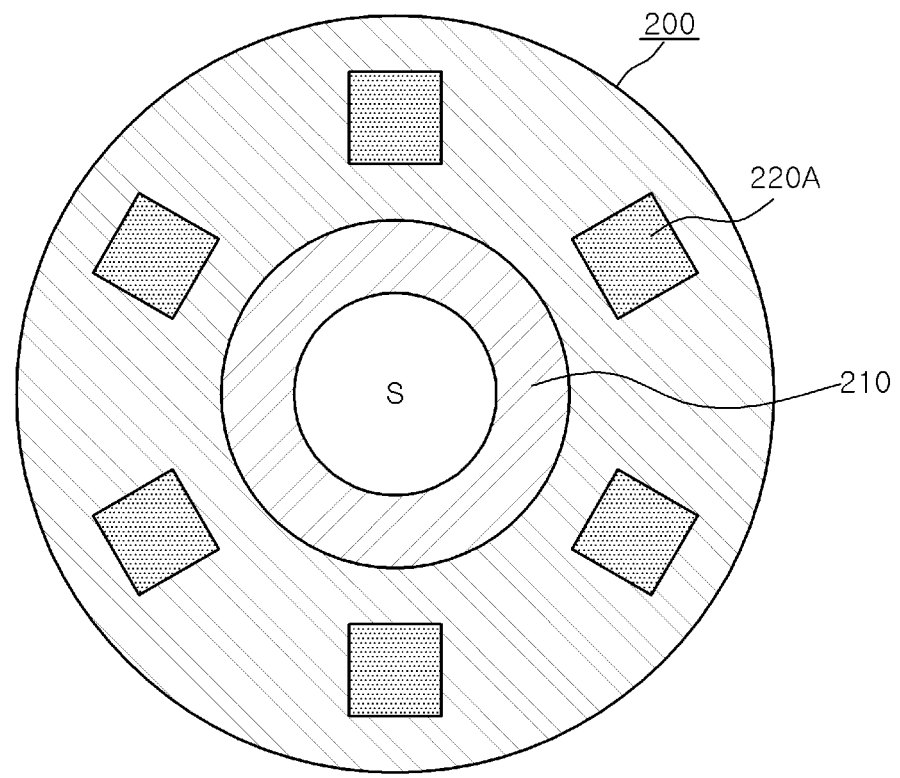

[Fig. 4b]
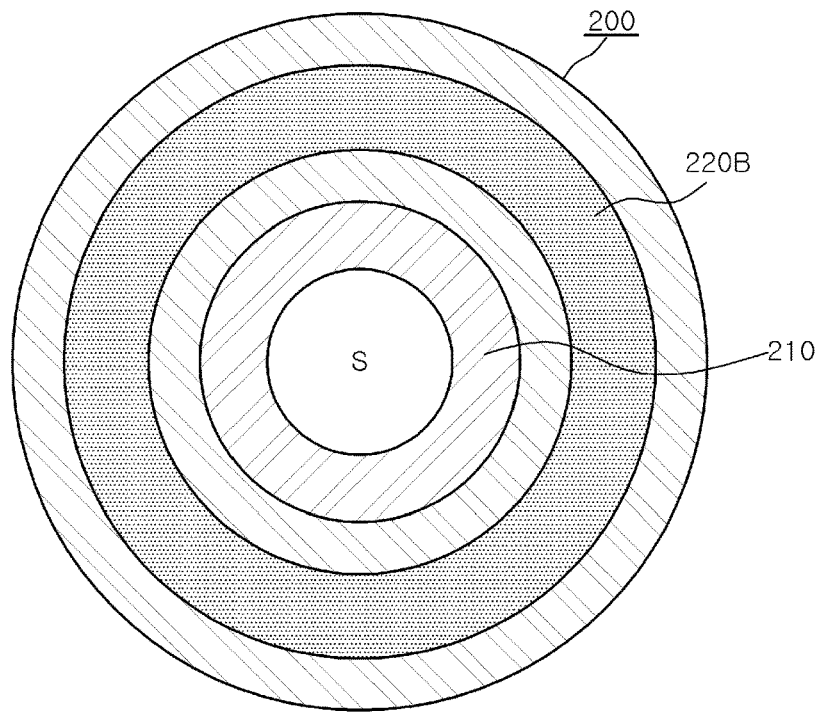
[Fig. 5]
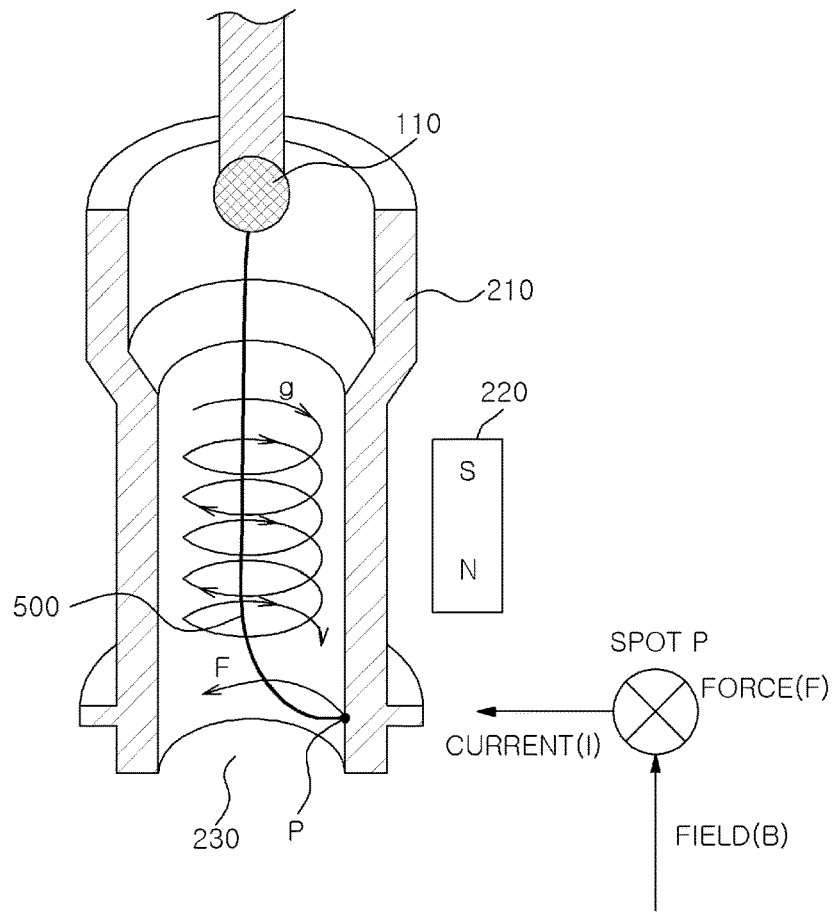

[Fig. 6]
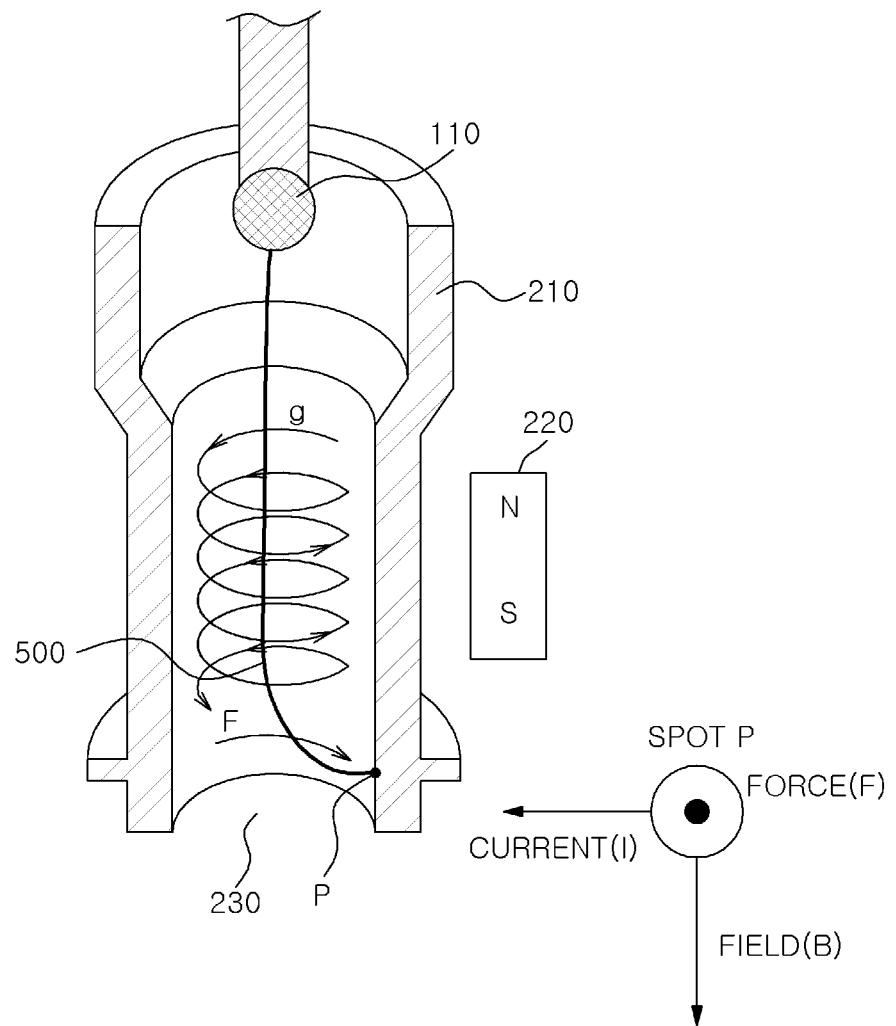

[Fig. 7]
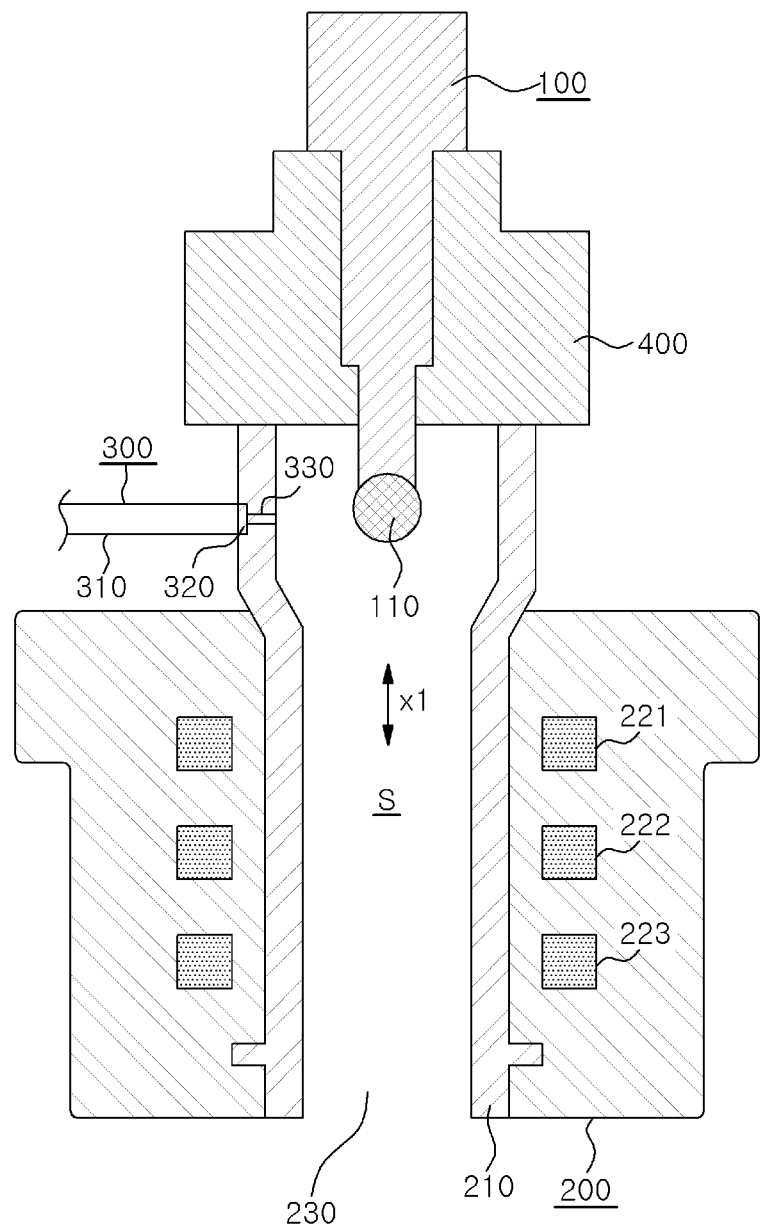

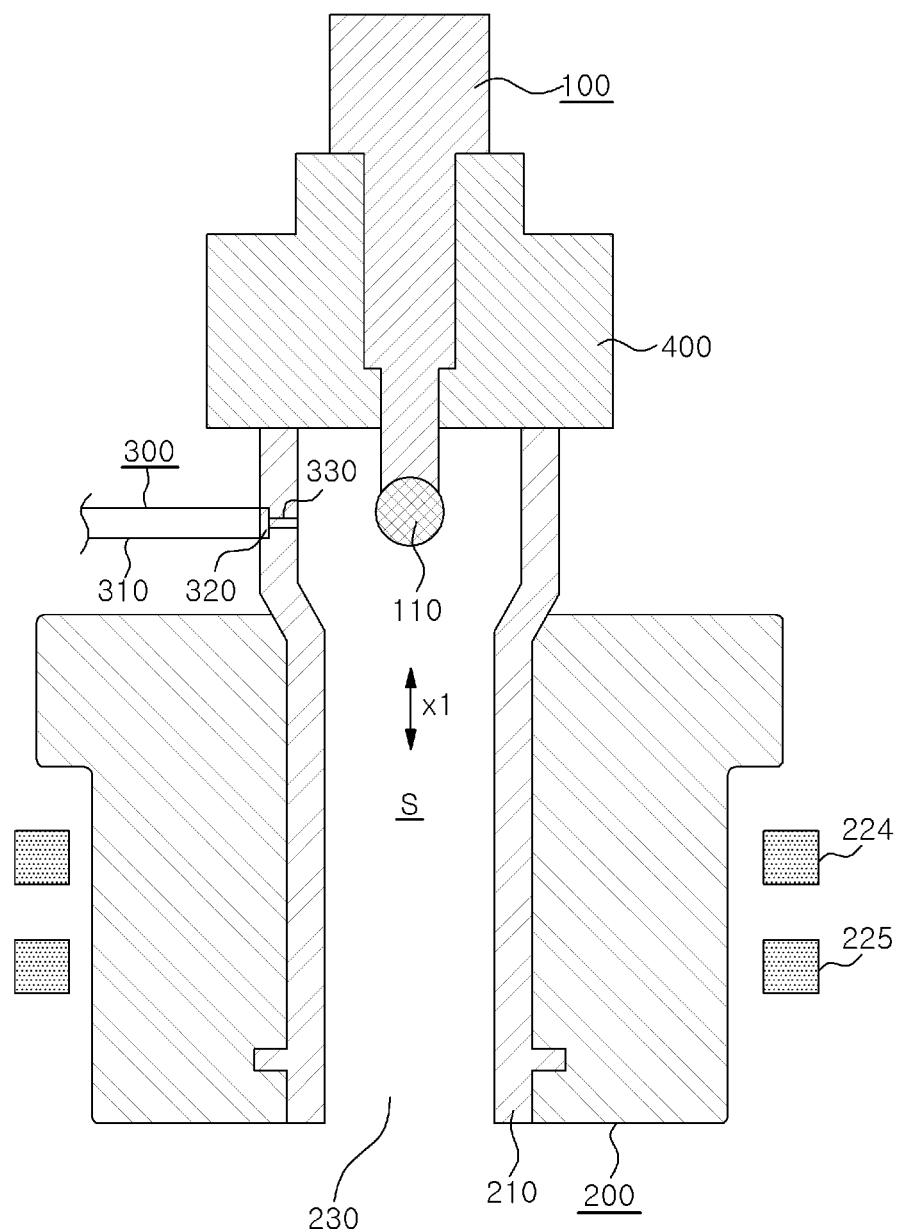
[Fig. 8]

[Fig. 9]
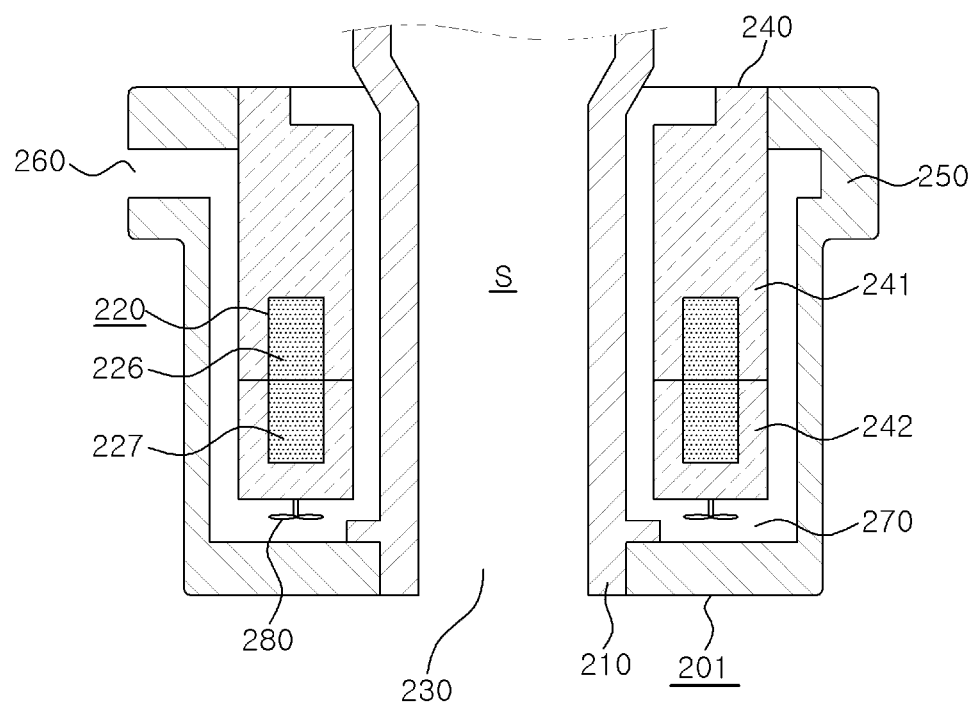

[Fig. 10]
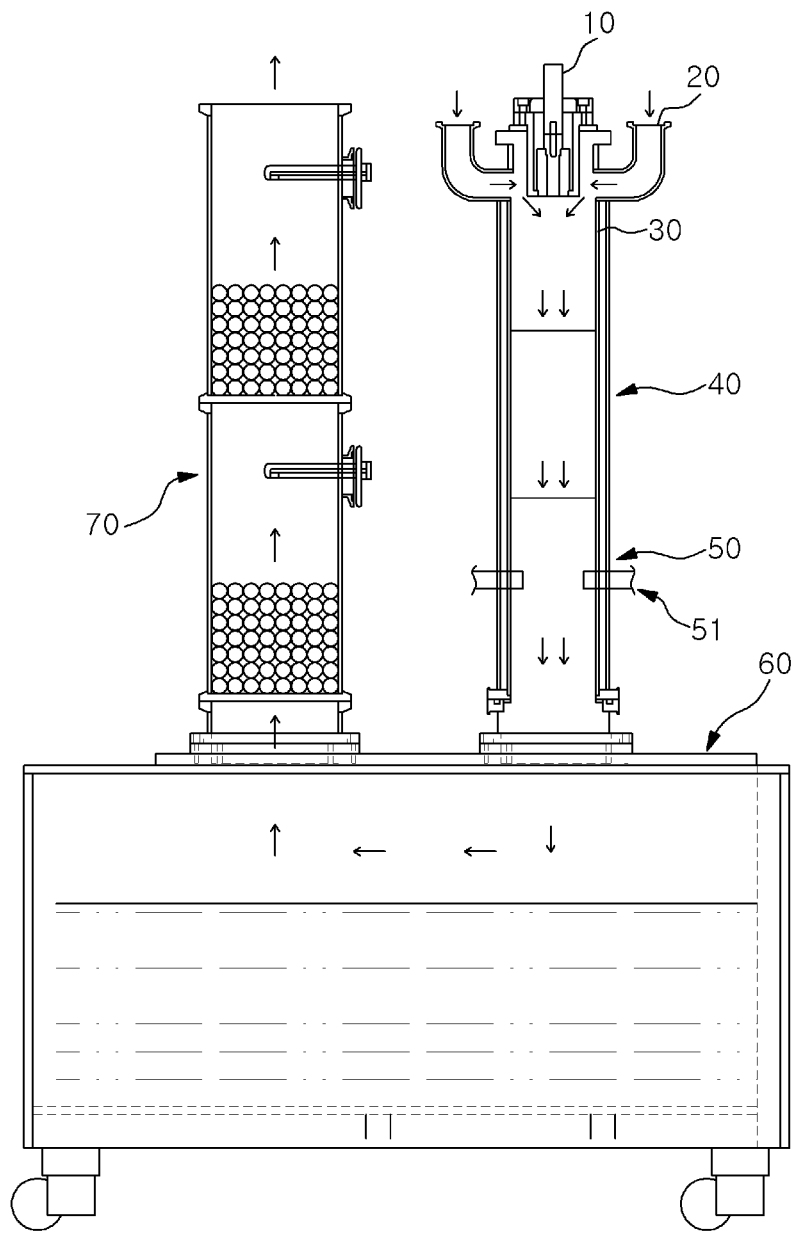

[Fig. 11]
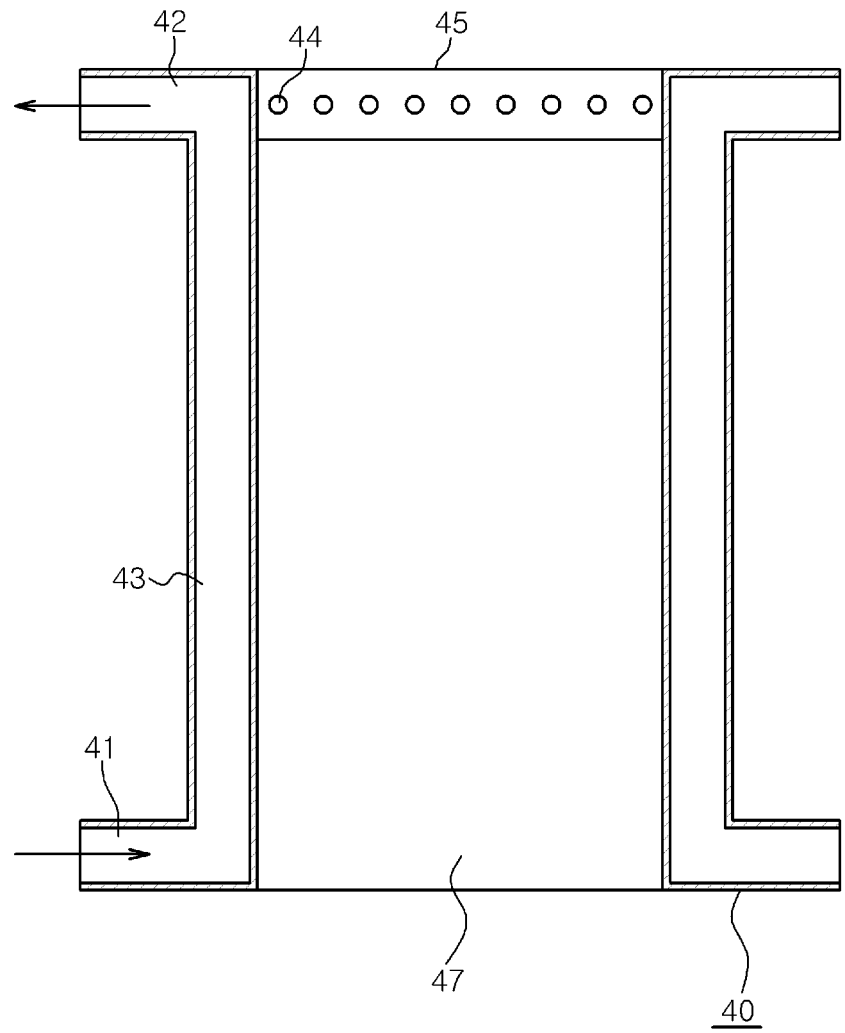
[Fig. 12]
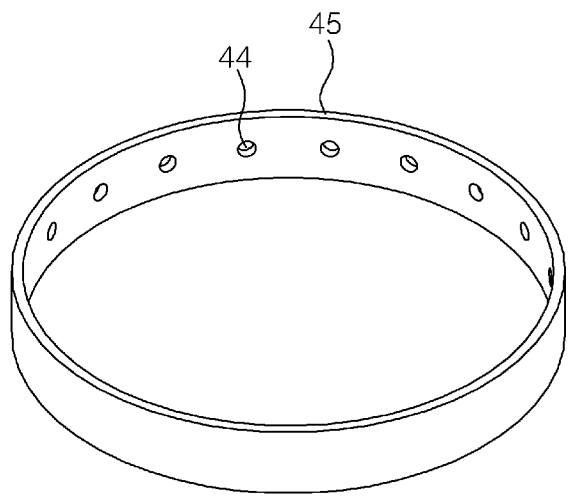

[Fig. 13]
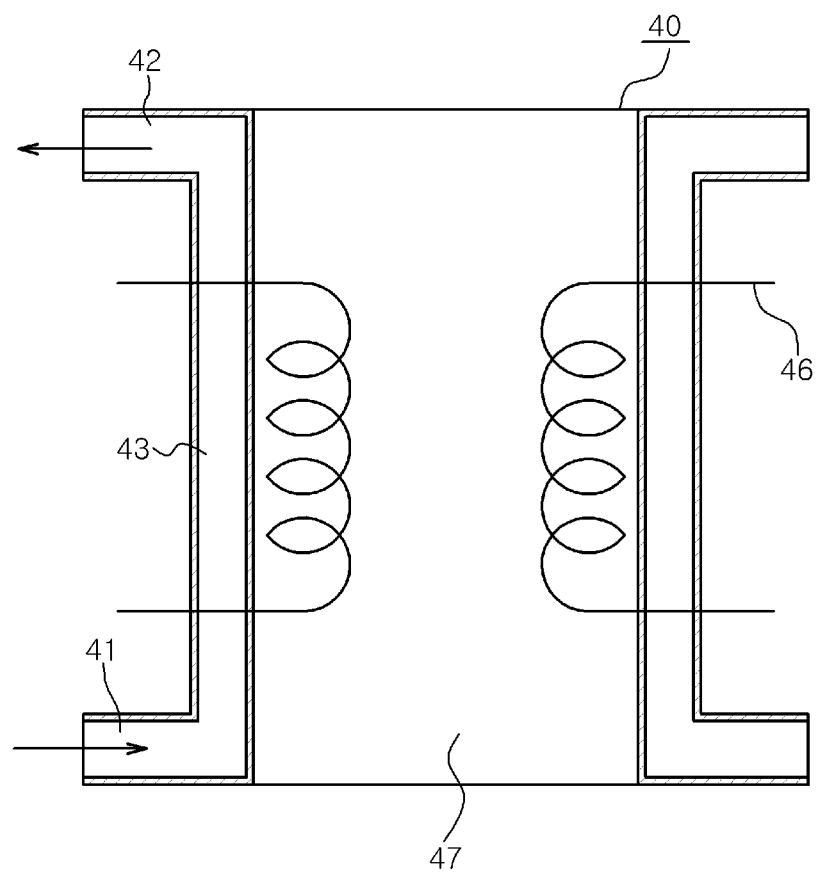

PLASMA GENERATING APPARATUS AND GAS TREATING APPARATUS

This application is a national stage entry under 35 U.S.C. § 371 of International Application No. PCT/KR2017/015691, filed Dec. 28, 2017, which claims the benefit of KR Application 10-2017-0010393, filed Jan. 23, 2017. The entire contents of International Application No. PCT/KR2017/015691 and KR Application 10-2017-0010393 are incorporated herein by reference.

TECHNICAL FIELD

The present disclosure relates to a plasma generating apparatus and a gas treating apparatus including the plasma generating apparatus.

BACKGROUND

Generally, methods for generating a plasma for processing a harmful gas (e.g., perfluoro compounds, chlorofluoro carbons, dioxin or the like) include shock, spark discharge, nuclear reaction, arc discharge and the like. For arc discharge, an arc may be generated by applying a high DC voltage to a space between two electrodes. The arc includes an arc spot, which is positioned on one of the electrodes.

When a gas capable of generating a plasma, such as an inert gas, nitrogen or the like, passes through the above-described arc and is heated to a considerably high temperature, the gas is ionized. In this manner, various reactive particles are formed and a plasma having a temperature of 1000° C. or above is generated.

By injecting the harmful gas into the plasma having a temperature of 1000° C. or above, the harmful gas is decomposed.

In operating a conventional plasma generating apparatus, however, the lifespan of the electrode assembly that includes the electrode is decreased because the position of the arc spot in the arc does not considerably change. Further, when a conventional plasma generating apparatus operates at a high voltage, the arc spot may deviate from the end portion of the plasma generating apparatus, resulting in the plasma state becoming drastically unstable.

Furthermore, when a conventional plasma generating apparatus is used to operate a conventional gas treating apparatus to decompose a harmful gas, a large amount of nitrogen oxide, considered as one of the air pollutants, is generated because the harmful gas is processed at a high temperature.

(Patent Document 1) Korean Patent Application Publication No. 10-2008-0105377 (published on Dec. 4, 2008.)

SUMMARY

In view of the above, it is an object of the present disclosure to provide a plasma generating apparatus capable of maintaining a plasma in a stable state.

It is a further object of the present disclosure to provide a technique for increasing the lifespan of the plasma generating apparatus by preventing the abrasion of an electrode assembly.

It is a further object of the present disclosure to provide a gas treating apparatus capable of effectively reducing nitrogen oxide In one embodiment of the present disclosure, a plasma generating apparatus comprises a cathode assembly including a cathode, an anode assembly including an anode having therein a plasma generation space, and one or more magnetic force generators configured to generate a magnetic force. The anode assembly has one end portion in which a gas supply path is provided and the other end portion having an opening, the gas supply path configured to supply a plasma generating gas to the plasma generation space. The gas supply path is configured to generate a vortex of the plasma generating gas in the plasma generation space and said one or more magnetic force generators are arranged such that the magnetic force is generated in a direction opposite to a rotational direction of the vortex of the plasma generating gas.

In one embodiment of the present disclosure, a gas treating apparatus comprises the plasma generating apparatus, a reaction chamber connected to the plasma generating apparatus and configured to process a gas supplied from an outside by a plasma, the processed gas containing a nitrogen oxide, and a nitrogen oxide reduction apparatus connected to the reaction chamber. The nitrogen oxide reduction apparatus includes a cooling unit configured to cool the processed gas to a temperature lower than a nitrogen oxide generation temperature.

The plasma generating apparatus, according to one embodiment of the present disclosure, provides the advantage of being able to stably generate a plasma and increase the lifespan of the electrode by arranging the magnetic force generators to produce a force opposite the rotational direction of the vortex of the plasma generating gas that is generated in the plasma generation space.

Further, the plasma generating apparatus according to the embodiments of the present disclosure provides the advantage of increasing the lifespan of the guide member surrounding the electrode while reducing the cost by using various materials to materialize the guide member.

The gas treating apparatus according to the embodiments of the present disclosure provides the advantage of effectively reducing nitrogen oxide without decreasing the harmful gas processing efficiency by using the cooling unit to rapidly cool the plasma-processed gas to a temperature lower than a nitrogen oxide generation temperature.

BRIEF DESCRIPTION OF THE DRAWINGS

FIG. 1 schematically shows a plasma generating apparatus according to one embodiment of the present disclosure.

FIG. 2 is a cross sectional view of the plasma generating apparatus, taken along line "II-II" of FIG. 1.

FIG. 3 is another cross sectional view of the plasma generating apparatus, taken along line "III-III" of FIG. 1.

FIG. 4A is a cross sectional view of the plasma generating apparatus, taken along line "IVA-IVA" of FIG. 1.

FIG. 4B is another cross sectional view of the plasma generating apparatus, taken along line "IVB-IVB" of FIG. 1.

FIG. 5 shows a direction of a force applied to an anode arc spot of the plasma generating apparatus according to an embodiment of the present disclosure.

FIG. 6 shows a direction of a force applied to the anode arc spot of the plasma generating apparatus according to an embodiment of the present disclosure.

FIG. 7 schematically shows a plasma generating apparatus according to another embodiment of the present disclosure.

FIG. 8 schematically shows a plasma generating apparatus according to still another embodiment of the present disclosure.

FIG. 9 shows a configuration of an anode assembly according to an embodiment of the present disclosure.

FIG. 10 schematically shows a gas treating apparatus according to an embodiment of the present disclosure.

FIG. 11 shows a nitrogen oxide reduction apparatus according to an embodiment of the present disclosure.

FIG. 12 shows a gas supply ring according to an embodiment of the present disclosure.

FIG. 13 shows a nitrogen oxide reduction apparatus according to another embodiment of the present disclosure.

DETAILED DESCRIPTION

The advantages and features of the present disclosure and the methods of accomplishing such will be clearly understood from the following description taken in conjunction with the accompanying drawings. However, embodiments are not limited to those embodiments described, as embodiments may be implemented in various forms. It should be noted that the present embodiments are provided to make a full disclosure and also to allow those skilled in the art to know the full range of the embodiments. Therefore, the embodiments are to be defined only by the scope of the appended claims.

In describing the embodiments of the present disclosure, if it is determined that the detailed description of related known components or functions unnecessarily obscures the gist of the present disclosure, the detailed description thereof will be omitted. Further, the terminologies to be described below are defined in consideration of the functions of the embodiments of the present disclosure and may vary depending on a user's or an operator's intention or practice. Accordingly, the definition thereof may be made on a basis of the content throughout the specification.

FIG. 1 schematically shows a plasma generating apparatus according to an embodiment of the present disclosure. The plasma generating apparatus may be a plasma torch.

The plasma generating apparatus includes: a cathode assembly 100 for generating an arc discharge by a high voltage applied thereto; an anode assembly 200 for generating a plasma having a temperature of 1000° C. or above in a plasma generation space S formed by the arc discharge between the anode assembly 200 and the cathode assembly 100; a gas introduction line (plasma generating gas introduction line) 300 for supplying a plasma generating gas to the plasma generation space S; and a magnetic force generator 220 for generating a magnetic force in the plasma generation space S.

The cathode assembly 100 will be described in detail hereinafter.

The cathode assembly 100 has a cathode 110 that a high voltage is applied to at a lower portion thereof. Further, the cathode assembly 100 may have therein a path through which cooling water flows. A cooling water path extends to the cathode 110 and allows the high-temperature cathode 110 to be cooled effectively during the operation of the cathode assembly 100. Accordingly, the abrasion of the cathode 110 can be prevented.

Preferably, the cathode 110 is made of hafnium or tungsten added with thorium or yttrium. However, the cathode 110 may contain another metal.

As shown in FIG. 1, one end portion of the cathode assembly 100 is positioned outside the anode assembly 200, and the other end portion of the cathode assembly 100 (i.e., the side where the cathode 110 is provided) is coupled with the anode assembly 200 to be located in the plasma generation space S of the anode assembly 200.

An insulator 400 is interposed between the cathode assembly 100 and the anode assembly 200. Accordingly, the cathode assembly 100 and the anode assembly 200 are insulated from each other.

Next, the anode assembly 200 will be described in detail hereinafter.

The anode assembly 200 is formed in a cylindrical shape so that the plasma generation space S can be formed therein while surrounding the cathode 110 of the cathode assembly 100. The anode assembly 200 includes an anode 210 for generating a plasma between the anode 210 and the cathode 110 by applying a high voltage to the cathode 110.

In other words, the anode assembly 200 has therein the plasma generation space S where a plasma is generated by DC arc discharge between the anode assembly 200 and the cathode assembly 100. The cathode 110 of the cathode assembly 100 is positioned at an upper portion of the plasma generation space S. The DC arc discharge occurs between the cathode 110 and the anode 210 by the high voltage applied to the cathode assembly 100.

At this time, an axis X1 of the anode assembly 200 may coincide with an axis of the cathode assembly 110.

A plasma generating gas introduction line 300 extending from an external plasma generating gas supply unit (not shown) to the plasma generation space S is provided at one end portion (i.e., upstream end portion) of the anode assembly 200. An opening 230 is provided at the other end portion (i.e., downstream end portion) of the anode assembly 200. The opening 230 may be referred to as a "torch outlet". The plasma flame is discharged through the opening 230.

A plasma generating gas introduction line 300 is configured to communicate with the plasma generation space S.

The plasma generating gas, e.g., one selected from a group consisting of argon, nitrogen, helium, hydrogen, oxygen, vapor, ammonia and a mixture of some of these gases, is introduced into the plasma generation space S through the plasma generating gas introduction line 300. Then, the plasma generating gas is ionized by the arc discharge occurring in the plasma generation space S, thereby generating the plasma.

The plasma generating gas introduction line 300 includes an inlet path 310, a distribution space 320 and a plurality of gas supply paths 330. The plasma generating gas introduced into the distribution space 320 through the inlet path 310 can be distributed in the distribution space 320 formed along a circumferential direction of the anode 210 and then supplied to the plasma generation space S through the gas supply paths 330.

At this time, the gas supply paths 330 are formed in parallel with or inclined with respect to a radial direction of the axis X1 of the anode assembly 200. FIGS. 2 and 3 show that the gas supply paths 330 are inclined at a predetermined angle, e.g., an acute angle (an angle less than 90 degrees), with respect to the radial direction of the axis X1 of the anode assembly 200. With this arrangement, the plasma generating gas can be uniformly introduced into the plasma generation space S while generating a vortex or a spiral flow.

FIGS. 2 and 3 are cross sectional views taken along line "II (III)-II (III)" of FIG. 1 when viewed from the opening 230 of the anode assembly 200 toward the plasma generating gas introduction line 300 (i.e., when viewed from the bottom of the anode assembly 200).

In FIG. 2, the plasma generating gas is introduced into the plasma generation space S while rotating in a counterclockwise direction by the inclined gas supply paths 330. In FIG. 3, the plasma generating gas is introduced into the plasma generation space S while rotating in a clockwise direction by the gas supply paths 330 inclined at a different angle from that shown in FIG. 2.

Further, the gas supply paths 330 may be inclined with respect to the direction of the axis X1 of the anode assembly 200. In other words, the gas supply paths 330 may be inclined horizontally at a predetermined angle as illustrated in FIGS. 2 and 3, or may be inclined vertically at a predetermined angle, or may be inclined horizontally and vertically at predetermined angles.

When the outlets of the gas supply paths 330 are formed at positions facing the cathode assembly 100, specifically the cathode 110, the plasma generating gas is introduced to rotate around the cathode assembly 100. Accordingly, the plasma can be uniformly generated in the plasma generation space S.

The anode assembly 200 may have a plasma holding part_(not shown) extending from the lower end portion of the anode assembly 200. The plasma holding part maintains a plasma generated between the cathode 110 and the anode 210 in a stable state. When the anode assembly 200 has the plasma holding part, the plasma generation space S is extended to an inner space of the plasma holding part. By allowing the arc to occur at the inner space of the plasma holding part, the plasma may have an increased length in an axial direction and an increased diameter in a horizontal direction. The inner space of the plasma holding part may have, e.g., a shape in which an inner diameter is gradually increased with stepped portions toward a lower portion of the plasma holding part or a shape in which an inner diameter of the plasma generation space S becomes continuously greater toward a lower portion of the plasma holding part, as long as the generated plasma can be maintained in a stable state and guided downward.

Next, the magnetic force generator 220 will be described in detail hereinafter.

The magnetic force generator 220 is provided either inside or outside the anode assembly 200. The magnetic force generator 220 generating a magnetic force may be a permanent magnet or an electromagnet.

Further, the magnetic force generator 220 may include a plurality of permanent magnets or electromagnets arranged radially with respect to the axis X1 of the anode assembly 200 or may include a single ring-shaped permanent magnet or electromagnet.

FIG. 4A is a cross sectional view of the plasma generating apparatus, taken along line "IVA-IVA" of FIG. 1, showing that the magnetic force generator 220 includes a plurality of permanent magnets 220A embedded in the anode assembly 200 and arranged radially with respect to the axis X1 of the anode assembly 200. In FIG. 4A, the magnetic force generator 220 includes six permanent magnets 220A. However, the number of the permanent magnets 220A is not limited to six and may be smaller than six or may be greater than six.

FIG. 4B is a cross sectional view of another plasma generating apparatus, taken along line "IVBB-IVB" of FIG. 1, showing that the magnetic force generator 220 includes a single ring-shaped permanent magnet 220B embedded in the anode assembly 200. An axis of the permanent magnet 220B may coincide with the axis X1 of the anode assembly 200.

FIG. 7 schematically shows a plasma generating apparatus according to another embodiment of the present disclosure, showing that a plurality of permanent magnets 221, 222 and 223 arranged radially with respect to the axis X1 of the anode assembly 200 is provided at multiple levels inside the anode assembly 200.

FIG. 8 schematically shows a plasma generating apparatus according to still another embodiment of the present disclosure, showing that a plurality of permanent magnets 224 and 225 arranged radially with respect to the axis X1 of the anode assembly 200 is provided at multiple levels outside the anode assembly 200. The magnetic force generator 220 provided outside the anode assembly 200 is movable in a direction parallel with the axis X1 of the anode assembly 200 and in a direction perpendicular to the axis X1 of the anode assembly 200.

The embodiments of present disclosure are intended to provide a plasma generating apparatus that can improve the stability and durability by applying a force to an anode arc spot of the arc generated in the plasma generation space S by controlling the arrangement of the magnetic force generator 220. This will be described in detail with reference to FIG. 5.

FIG. 5 shows partial configurations of the cathode assembly 100 and the anode assembly 200 according to an embodiment of the present disclosure. When a high voltage is applied to the cathode 110 of the cathode assembly 100, an arc 500 occurs between the cathode 110 and the anode 210 in the plasma generation space S, and an anode arc spot P, which is a part of the arc 500, is positioned on the anode 210.

At this time, when the plasma generating gas is introduced into the plasma generation space S through the plasma generating gas introduction line 300, the position of the anode arc spot P is changed by the flow of the plasma generating gas. For example, if the plasma generating gas is introduced in the counterclockwise direction (see FIG. 2) when viewed from the opening 230 of the anode assembly 200 toward the plasma generating gas introduction line 300 (i.e., when viewed from the bottom of the anode assembly 200), the anode arc spot P is rotated in the counterclockwise direction by the plasma generating gas. In FIG. 5, the direction of the vortex of the plasma generating gas is indicated by "g".

When the plasma generating apparatus operates at a high voltage, the anode arc spot P is positioned near the opening 230 of the anode assembly 200. Due to the vortex of the plasma generating gas, the anode arc spot P may be deviated from the end portion of the anode assembly 200. In that case, the plasma becomes drastically unstable. In order to maintain the plasma in a stable state, it is required to increase the current or operate the plasma generating apparatus at a low voltage. However, according to an embodiment of the present disclosure, it is intended to prevent the anode arc spot P from deviating from the end portion of the anode assembly 200 without increasing the current or operating the plasma generating apparatus at a low voltage. To do so, the magnetic force generator 220 needs to be arranged such that a force is applied to the anode arc spot P in a direction opposite the rotational direction g of the plasma generating gas.

In FIG. 5, the magnetic force generator 220 is arranged such that the polarities of the magnetic force generator 220 become opposite to each other in the direction of the axis X1 of the anode assembly 200. In FIG. 5, the plasma generating gas is introduced in the counterclockwise direction as described above. At this time, the N pole of the magnetic force generator 220 is directed toward the opening 230 of the anode assembly 200 (i.e., toward the lower portion of the anode assembly 200) and the S pole of the magnetic force generator 220 is directed toward the cathode 110 (i.e., toward the upper portion of the anode assembly 200).

With this arrangement of the magnetic force generator 220, a magnetic field B, directed from the bottom to the top of the anode assembly 200, is induced in the plasma generation space S. The current flows from the anode 210 toward the cathode 110, and near the position of the anode arc spot P, the current I flows from the inner wall of the anode 210 toward the axis X1 of the anode assembly 200. In that case, according to Fleming's left hand rule, the force F is generated in a direction toward the ground at the position of the anode arc spot P. In other words, when the rotational direction g of the plasma generating gas is in the counterclockwise direction, the N pole of the magnetic force generator 220 is directed toward the opening 230 of the anode assembly 200 in order to apply the force F in the clockwise direction to the anode arc spot P. At this time, the force F in the clockwise direction may include a component directed from the bottom to the top of the anode assembly 200.

Accordingly, even when the plasma generating apparatus operates at a high voltage, the anode arc spot P does not deviated from the end portion of the anode assembly 200 and, further, the plasma can be stably generated in the plasma generation space S. In addition, it is possible to avoid abrasion and loss of the anode assembly 200, which are caused when the arc is concentrated at a specific portion of the anode assembly 200 by moving the anode arc spot P by the force generated by the magnetic field B induced by the magnetic force generator 220. As a result, the lifespan of the anode assembly 200 can be extended.

FIG. 6 shows the partial configurations of the cathode assembly 100 and the anode assembly 200 according to an embodiment of the present disclosure, showing that the rotational direction g of the plasma generating gas is different from that shown in FIG. 5. For example, if the plasma generating gas is introduced in the clockwise direction (see FIG. 3) when viewed from the opening 230 of the anode assembly 200 toward the plasma generating gas introduction line 300 (i.e., when viewed from the bottom to the top of the anode assembly 200), the anode arc spot P is rotated in the clockwise direction by the plasma generating gas.

At this time, the S pole of the magnetic force generator 220 is directed toward the opening 230 of the anode assembly 200 (i.e., toward the lower portion of the anode assembly 200) and the N pole of the magnetic force generator 220 is directed toward the cathode 110 (i.e., toward the upper portion of the anode assembly 200).

With this arrangement of the magnetic force generator 220, the magnetic field B directed from the top to the bottom of the anode assembly 200 is induced in the plasma generation space S. The current flows from the anode 210 toward the cathode 110, and near the position of the anode arc spot P, the current I flows from the inner wall of the anode 210 toward the axis X1 of the anode assembly 200. In that case, according to Fleming's left hand rule, the force F is generated in a direction upward from the ground at the position of the anode arc spot P. In other words, when the rotational direction g of the plasma generating gas is in the clockwise direction, the S pole of the magnetic force generator 220 may be directed toward the opening 230 of the anode assembly 200 in order to apply a force F in the counterclockwise direction to the anode arc spot P. At this time, the force F in the counterclockwise direction may include a component directed from the bottom to the top of the anode assembly 200.

Accordingly, even when the plasma generating apparatus operates at a high voltage, the plasma can be stably generated and the lifespan of the anode assembly 200 can be extended.

In FIGS. 5 and 6, the arrangements of the polarities of the single magnetic force generator are illustrated, for example. As in the cases shown in FIGS. 5 and 6, the polarities of the multiple permanent magnets 220A shown in FIG. 4A, the polarities of the multiple magnetic force generators 221 to 223 shown in FIG. 7 and the polarities of the multiple magnetic force generators 224 and 225 shown in FIG. 8 may also be arranged such that a force is generated in the direction opposite the rotational direction of the plasma generating gas. Similarly, the ring-shaped permanent magnet 220B shown in FIG. 4B may be magnetized such that the polarities become opposite to each other in the direction of the axis X1 of the anode assembly 200 to thereby generate a force in the direction opposite the rotational direction of the plasma generating gas.

In FIGS. 5 and 6, the magnetic force generator 220 is arranged such that the force is applied to the anode arc spot P in the direction opposite the rotational direction g of the plasma generating gas. However, the arrangement of the magnetic force generator 220 is not limited thereto. Depending on the purpose, the magnetic force generator 220 may be arranged such that the force is applied to the anode arc spot P in the same direction as the rotational direction g of the plasma generating gas. For example, when the plasma generating gas is introduced in the counterclockwise direction as shown in FIG. 5, the S pole of the magnetic force generator 220 may be directed toward the opening 230 of the anode assembly 200 and the N pole of the magnetic force generator 220 may be directed toward the cathode 110. In this case, the magnetic field directed from the top to the bottom of the anode assembly 200 is induced in the plasma generation space S and the force in the counterclockwise direction is applied to the anode arc spot P. When the plasma generating gas is introduced in the clockwise direction as shown in FIG. 6, the N pole of the magnetic force generator 220 may be directed toward the opening 230 of the anode assembly 200 and the S pole of the magnetic force generator 220 may be directed toward the cathode 110. In that case, the magnetic field directed from the bottom to the top of the anode assembly 200 is induced in the plasma generation space S and the force in the clockwise direction is applied to the anode arc spot P.

In order to increase the lifespan of the anode assembly 200, various materials may be used for a guide member included in the anode assembly 200. This will be described in detail with reference to FIG. 9.

FIG. 9 shows a configuration of an anode assembly 201 according to another embodiment of the present disclosure. The anode assembly 201 shown in FIG. 9 may be used in the plasma generating apparatus of FIG. 1, instead of the anode assembly 200. Redundant description of the same components in FIGS. 1 and 9 is omitted.

The anode assembly 201 includes an anode 210 for generating a plasma between the anode 210 and the cathode 110 by applying a high voltage to the cathode 110, a guide member 240 surrounding the anode 210, and a housing 250 surrounding the guide member 240. The anode 210, the guide member 240 and the housing may have a cylindrical shape. The magnetic force generator 220 may be provided inside the guide member 240.

The guide member 240 may be made of metal or plastic. Preferably, the guide member 240 is made of plastic. When the guide member 240 is made of plastic, the magnetic field induced by the magnetic force generator 220 can be unchanged and the generation of a parasitic current, which may interfere or affect the magnetic field, can be prevented. Further, when the guide member 240 is made of plastic, heat is not transferred to the magnetic force generator 220 and, thus, the magnetic properties of the magnetic force generator 220 are not affected.

The guide member 240 includes a first guide 241 provided at an upper portion (i.e., the plasma generating gas introduction line 300 side in FIG. 1) and a second guide 242 provided at a lower portion (i.e., the opening 230 side in FIG. 1). The second guide 242 is made of plastic having a heat resistance higher than that of the first guide 241. The first guide member 241 may be made of plastic having low heat resistance, e.g., at least one of PVC (Polyvinyl Chloride) and nylon. The second guide member may be made of plastic having high heat resistance, e.g., at least one of PTFE (polytetrafluoroethylene) and PEEK (polytetrafluoroethylene). The anode assembly 201 near the opening 230 (i.e., near the torch outlet) has a relatively high temperature than the other portion of the anode assembly 201. However, by using those materials for the guide member 240, it is possible to prevent deterioration or melting of the anode assembly 201 near the opening 230 without a high cost.

The magnetic force generator 220 may be provided inside the guide member 240. At this time, the magnetic force generator 220 may be divided into a first magnetic force generator 226 provided inside the first guide 241 and a second magnetic force generator 227 provided inside the second guide 242. The first guide 241 and the second guide 242 may be coupled by screws or an adhesive agent. On the other hand, the first guide 241 and the second guide 242 may be coupled by a magnetic force generated by the polarities of the first magnetic force generator 226 and the second magnetic force generator 227.

The housing 250 may be made of stainless steel. A coolant path 270 is formed between the housing 250 and the guide member 240 and between the guide member 240 and the anode 210. Coolant (e.g., cooling water) supplied from a coolant supplier 260 flows through the coolant path 270, thereby cooling the anode assembly 201.

More specifically, the coolant flows downward through the coolant path 270 formed between the housing 250 and the guide member 240, and then flows through the coolant path 270 formed below a bottom surface of the guide member 240, and then flows upward through the coolant path 270 formed between the guide member 240 and the anode 210.

At this time, a fin 280 may be provided at the coolant path 270 formed below the bottom surface of the guide member 240. The fin 280 circulates the coolant more efficiently. Accordingly, the temperature of the anode assembly 201 near the opening 230 (i.e., near the torch outlet), which is relatively higher, can be effectively decreased.

The above-described plasma generating apparatus may be an apparatus for processing a material selected from a group consisting of perfluoro compounds, chlorofluoro carbons, hydrofluorocarbons, hydrochlorofluoro carbons, dioxin, furan, volatile organic compounds, polychlorinated biphenyl, and a compound thereof.

The configuration of the plasma generating apparatus having improved stability and durability has been described.

In the case of decomposing a harmful gas by using a plasma generating apparatus, the harmful gas is processed at a high temperature and this may generate nitrogen oxide. Particularly, at a high temperature of about 800° C. or above, the amount of thermal NOx (Nitrogen Oxide) produced by a reaction with a reactant gas containing oxygen is increased. The nitrogen oxide causes acid rain and photochemical smog and is considered as one of the main air pollutants. Therefore, a technique capable of reducing nitrogen oxide is required.

Conventionally, a catalytic device or a dilution device was used for processing nitrogen oxide. However, those devices are not cost-effective. As another solution, the use of an oxygen-containing material has been avoided to prevent the generation of nitrogen oxide. However, in the case of decomposing the harmful gas by using a material that does not contain oxygen, another toxic substance or other by-product is generated and deposited on the inner surface of the apparatus. Also, the harmful gas processing efficiency is decreased.

In order to resolve the above drawbacks, one embodiment of the present disclosure is intended to provide a nitrogen oxide reduction apparatus capable of effectively reducing nitrogen oxide without decreasing the harmful gas processing efficiency, and a gas treating apparatus including the nitrogen oxide reduction apparatus.

Hereinafter, the gas treating apparatus including the nitrogen oxide reduction apparatus capable of reducing nitrogen oxide will be described in detail.

FIG. 10 schematically shows the gas treating apparatus according to an embodiment of the present disclosure. A plasma scrubber is illustrated as an example of the gas treating apparatus.

In a semiconductor manufacturing process, acid gases such as $BCl_3$, $Cl_2$, $F_2$, HBr, HCl, HF and the like and PFCs gases such as $CF_4$, $CHF_3$, $C_2F_6$, $C_3F_8$, $C_4F_6$, $C_4F_8$, $C_5F_8$, $SF_6$ and the like are used for etching a surface of a wafer. In a CVD (Chemical Vapor Deposition) process, gases such as $AsH_3$, $NH_3$, $PH_3$, $SiH_4$, $Si_2H_2Cl_2$ and the like are used in a deposition step of the surface of the wafer, and PFCs gases such as $NF_3$, $C_2F_6$, $C_3F_8$ and the like are used in a cleaning step. The plasma scrubber is used for processing these gases.

The plasma scrubber includes a reaction chamber 30 and a nitrogen oxide reduction apparatus (a nitrogen oxide reduction chamber) 40. The plasma scrubber may further include a plasma torch 10, a pipe 50, a water tank 60 and an after-treatment unit 70.

The plasma torch 10 is a plasma generating apparatus for generating a plasma flame for thermally decomposing a gas introduced after the etching and the CVD process at a high temperature. The plasma generating apparatus described with reference to FIGS. 1 to 9 may be used as the plasma torch 10.

The reaction chamber 30 is connected to the plasma torch 10 and provides a space where the gas supplied through the gas supply line 20 is thermally decomposed by a high-temperature plasma. When the temperature in the reaction chamber reaches about 800° C. or above, thermal NOx is drastically generated. In order to suppress the generation of thermal NOx, the nitrogen oxide reduction apparatus 40 is connected to a rear end of the reaction chamber 30. The nitrogen oxide reduction apparatus 40 will be described in detail later.

The pipe 50 is connected to a rear end of the nitrogen oxide reduction apparatus 40. The pipe 50 has a water injection nozzle 51 formed at a sidewall thereof. The water injection nozzle 51 sprays water in a fine mist state, thereby quickly cooling the gas processed in the reaction chamber 30.

The after-treatment unit 70 uses the water injection nozzle to process water-soluble or acid gas and particulate materials that are generated after the decomposition. The water tank 60 is configured to store and drain water and the particulate materials introduced from the pipe 50 and the after-treatment unit 70.

Hereinafter, the nitrogen oxide reduction apparatus 40 will be described in detail with reference to FIG. 11. The nitrogen oxide reduction apparatus 40 includes a cylindrical housing (tube) 47. An opening at one end of the housing 47 is connected to the rear end of the reaction chamber 30. An opening at the other end of the housing 47 is connected to a leading end of the pipe 50. The gas processed by the plasma in the reaction chamber 30 flows through the reaction chamber 30, the nitrogen oxide reduction apparatus 40, and the line 50 in that order. The nitrogen oxide reduction apparatus 40 includes a cooling unit for rapidly cooling the gas processed in the reaction chamber 30 to a temperature lower than a nitrogen oxide generation temperature.

FIG. 11 shows a plurality of gas injection nozzles 44 as an example of the cooling unit. The gas injection nozzles 44 may be arranged radially with respect to the axis of the housing 47. The gas injection nozzles 44 may be formed at the housing 47 or may be formed at a gas supply ring 45 that is a separate member in the housing 47. The gas supply ring 45 may be formed in an annular shape and positioned inside the housing 47 of the nitrogen oxide reduction apparatus 40.

FIG. 12 shows the annular gas supply ring 45 having a plurality of gas injection nozzles 44. The gas injection nozzles 44 may be spaced apart from each other at a regular interval on the gas supply ring 45.

A low-temperature gas is injected into the inner space of the nitrogen oxide reduction apparatus 40 through the gas injection nozzles 44. At this time, a gas having no reactivity or low reactivity is used as the low-temperature gas. For example, an inert gas containing at least one of nitrogen gas and argon gas may be used as the low-temperature gas.

The temperature of the low-temperature gas is low enough to rapidly cool the gas processed in the reaction chamber 30 to a temperature lower than the nitrogen oxide generation temperature. For example, the low-temperature gas has a temperature of about 300° C. or less.

When the high-temperature gas processed in the reaction chamber 30 reaches the nitrogen oxide reduction apparatus 40, the low-temperature gas injected from the gas injection nozzles 44 rapidly cools the high-temperature gas. Accordingly, the generation of nitrogen oxide is reduced.

The gas injection nozzles 44 may be formed at any position along the axial direction of the housing 47 of the nitrogen oxide reduction apparatus 40. The gas injection nozzles 44 may be formed at multiple levels with different heights. When the gas injection nozzles 44 are close to the reaction chamber 30, the harmful gas processing efficiency may be decreased, and when the gas injection nozzles 44 are far from the reaction chamber 30, the nitrogen oxide reducing effect is decreased. Therefore, the gas injection nozzles 44 need to be arranged at a position where a desired harmful gas processing efficiency and a desired nitrogen oxide reducing effect can be achieved.

For example, the temperature of the nitrogen oxide reduction apparatus 40 becomes lower toward a position far from the reaction chamber 30. In the case of providing the gas injection nozzles 44 at a position where the temperature of the nitrogen oxide reduction apparatus 40 reaches about 800° C., the generation of nitrogen oxide can be effectively suppressed without decreasing the harmful gas processing efficiency.

In addition, a cooling water path 43 may be formed between an outer wall and an inner wall of the nitrogen oxide reduction apparatus 40. Cooling water is introduced from a cooling water inlet line 41 connected to a lower end of the nitrogen oxide reduction apparatus 40. Then, the cooling water flows from the bottom to the top of the cooling water path 43 and discharged from a cooling water outlet line 42 connected to an upper end of the nitrogen oxide reduction apparatus 40. Accordingly, the nitrogen oxide reduction apparatus 40 is cooled by the cooling water and the generation of nitrogen oxide is reduced more effectively.

FIG. 13 shows a nitrogen oxide reduction apparatus 40 according to another embodiment of the present disclosure. Redundant description of the same components in FIGS. 1 and 13 is omitted.

The nitrogen oxide reduction apparatus 40 shown in FIG. 13 includes a heat exchanger 46 as a cooling unit. The heat exchanger 46 may include a plurality of heat exchange pipes through which liquefied hydrogen or BOG (Boil-off Gas) flows. On the other hand, the heat exchanger 46 may include a plate, a tube or the like that exchanges heat. When the high-temperature gas processed in the reaction chamber 30 reaches the nitrogen oxide reduction apparatus 40, the heat exchanger 46 quickly cools the high-temperature gas. Accordingly, the generation of nitrogen oxide is reduced.

The cooling unit installed at the nitrogen oxide reduction apparatus 40 is not limited to the gas injection nozzle 44 or the heat exchanger 46. Any other units can be used as the cooling unit as long as they can quickly cool the gas from the reaction chamber 30. As for the cooling unit, both of the gas injection nozzle 44 and the heat exchanger 46 may be used.

The embodiments of the present disclosure can effectively reduce nitrogen oxide by cooling the plasma-processed gas by using the cooling unit without decreasing the harmful gas processing efficiency.

The embodiments of the present disclosure have been described based on the embodiments illustrated in the accompanying drawings. However, the above description is merely an example, and it will be understood by those skilled in the art that various changes and modifications can be made. Therefore, the technical protection scope of the present disclosure should be determined by the technical idea of the appended claims.

DESCRIPTION OF REFERENCE NUMERALS

40: nitrogen oxide reduction apparatus
41: cooling water inlet line
42: cooling water outlet line
43: cooling water path
44: gas injection nozzle
45: gas supply ring
46: heat exchanger
47: housing
100: cathode assembly
110: cathode
200: anode assembly
210: anode
220: magnetic force generator
230: opening
300: plasma generating gas introduction line
400: insulator
500: arc
S: plasma generation space
X1: axis of anode assembly
g: direction of vortex of plasma generating gas
P: arc anode spot
F: force applied to arc anode spot

The invention claimed is:

1. A plasma generating apparatus comprising:
a cathode assembly including a cathode;
an anode assembly including an anode having therein a plasma generation space; and
one or more magnetic force generators configured to generate a magnetic force,
wherein the anode assembly has one end portion in which a gas supply path is provided and the other end portion having an opening, the gas supply path configured to supply a plasma generating gas to the plasma generation space,
wherein the gas supply path is configured to generate a vortex of the plasma generating gas in the plasma generation space and the one or more magnetic force generators are arranged such that the magnetic force is generated in a direction opposite to a rotational direction of the vortex of the plasma generating gas,
wherein the anode assembly further includes a guide member surrounding the anode, and
wherein the guide member is made of a plastic material and the one or more magnetic force generators are provided inside the guide member.

2. The plasma generating apparatus of claim 1, wherein the one or more magnetic force generators are arranged such that the magnetic force is applied to an arc spot generated between the cathode and the anode in the direction opposite to the rotational direction of the vortex of the plasma generating gas.

3. The plasma generating apparatus of claim 1, wherein the one or more magnetic force generators are arranged such that polarities thereof become opposite to each other in a direction of an axis of the anode assembly.

4. The plasma generating apparatus of claim 3, wherein, when viewed from the opening toward the gas supply path, N poles of the one or more magnetic force generators are directed toward the opening when the rotational direction of the vortex of the plasma generating gas is a counterclockwise direction and S poles of the one or more magnetic force generators are directed toward the opening when the rotational direction of the vortex of the plasma generating gas is a clockwise direction.

5. The plasma generating apparatus of claim 1, wherein the gas supply path is inclined with respect to a radial direction of an axis of the anode assembly.

6. The plasma generating apparatus of claim 1, wherein the one or more magnetic force generators are provided inside or outside the anode assembly.

7. The plasma generating apparatus of claim 1, wherein the one or more magnetic force generators include a plurality of permanent magnets arranged radially with respect to an axis of the anode assembly.

8. The plasma generating apparatus of claim 1, wherein the one or more magnetic force generators include a ring-shaped permanent magnet.

9. The plasma generating apparatus of claim 1, wherein the one or more magnetic force generators are movable in a direction parallel with an axis of the anode assembly and in a direction perpendicular to the axis of the anode assembly.

10. The plasma generating apparatus of claim 1,
wherein the guide member includes a first guide provided at the gas supply path side and a second guide provided at the opening side, and
wherein a heat resistance of the second guide is higher than a heat resistance of the first guide.

11. The plasma generating apparatus of claim 1, wherein the anode assembly further includes a housing surrounding the guide member and a coolant path formed between the housing and the guide member and between the guide member and the anode.

12. A gas treating apparatus comprising:
the plasma generating apparatus described in claim 1;
a reaction chamber connected to the plasma generating apparatus and configured to process a gas supplied from an outside by a plasma, the processed gas containing a nitrogen oxide; and
a nitrogen oxide reduction apparatus connected to the reaction chamber,
wherein the nitrogen oxide reduction apparatus includes a cooling unit configured to cool the processed gas to a temperature lower than a nitrogen oxide generation temperature.

13. The gas treating apparatus of claim 12, wherein the cooling unit includes one or more gas injection nozzles configured to inject a low-temperature gas.

14. The gas treating apparatus of claim 13, wherein the gas injection nozzles are provided at multiple locations of the nitrogen oxide reduction apparatus, and the low-temperature gas is an inert gas.

15. The gas treating apparatus of claim 14, wherein the inert gas contains at least one of nitrogen gas and argon gas.

16. The gas treating apparatus of claim 13, wherein
the nitrogen oxide reduction apparatus further includes a cylindrical housing and an annular gas supply ring provided inside the cylindrical housing, and
the one or more gas injection nozzles are provided on the annular gas supply ring.

17. The gas treating apparatus of claim 12, wherein the cooling unit includes a heat exchanger.

18. A gas treating apparatus comprising:
a plasma generating apparatus comprising:
a cathode assembly including a cathode;
an anode assembly including an anode having therein a plasma generation space; and
one or more magnetic force generators configured to generate a magnetic force,
wherein the anode assembly has one end portion in which a gas supply path is provided and the other end portion having an opening, the gas supply path configured to supply a plasma generating gas to the plasma generation space, and
wherein the gas supply path is configured to generate a vortex of the plasma generating gas in the plasma generation space and the one or more magnetic force generators are arranged such that the magnetic force is generated in a direction opposite to a rotational direction of the vortex of the plasma generating gas;
a reaction chamber connected to the plasma generating apparatus and configured to process a gas supplied from an outside by a plasma, the processed gas containing a nitrogen oxide; and
a nitrogen oxide reduction apparatus connected to the reaction chamber,
wherein the nitrogen oxide reduction apparatus includes a cooling unit configured to cool the processed gas to a temperature lower than a nitrogen oxide generation temperature.

* * * * *